United States Patent [19]

Trzcinski et al.

[11] Patent Number: 4,763,062
[45] Date of Patent: Aug. 9, 1988

[54] CONDUCTIVE EMI TEST SYSTEM, A DECOUPLING NETWORK THEREFOR

[75] Inventors: David J. Trzcinski, Redford Township; Terry M. North, Harper Woods, both of Mich.

[73] Assignee: Chrysler Motors Corporation, Highland Park, Mich.

[21] Appl. No.: 915,365

[22] Filed: Oct. 6, 1986

[51] Int. Cl.$^4$ ............................................. G01R 27/00
[52] U.S. Cl. .................... 324/57 N; 324/57 Q; 324/475
[58] Field of Search .......... 324/57 N, 57 Q, 520–522, 324/546, 548, 475, 58.5 B; 333/165, 166

[56] References Cited

U.S. PATENT DOCUMENTS

| | | | |
|---|---|---|---|
| 1,227,114 | 5/1917 | Campbell | 324/57 Q |
| 1,869,515 | 8/1932 | Shanck | 324/57 N |
| 2,987,586 | 6/1961 | Berger | 324/475 X |
| 3,388,326 | 6/1968 | Brooks | 324/57 N |
| 3,639,703 | 2/1972 | Bergemann et al. | 324/57 N |
| 3,711,769 | 1/1973 | Peahe | 324/57 N |
| 3,970,795 | 7/1976 | Allen | 324/57 N X |
| 4,156,857 | 5/1979 | Silence et al. | 324/57 N X |
| 4,415,852 | 11/1983 | Ashley et al. | 324/57 N |
| 4,491,783 | 1/1985 | Shwayama et al. | 324/57 N |

Primary Examiner—M. H. Paschall
Assistant Examiner—A. Jonathan Wysocki
Attorney, Agent, or Firm—Wendell K. Fredericks

[57] ABSTRACT

Development of worst case operating environment, interfering parameters of a test item, is effected by a decoupling device. The device includes a series of resonators configured and interconnected in a particular manner along with a shunt capacitance group. When connected between the test item and its support system, the device provides such an impedance to signals other than those need for normal operation, that the highest noise voltage levels emit from the test item. These levels permit developing repeatable worse cases inteference parameters which provide a guide for modifying the test item circuit components and connectors so as to minimize the affects of generating EMI sources or to immunize susceptible receptors within the test item.

10 Claims, 5 Drawing Sheets

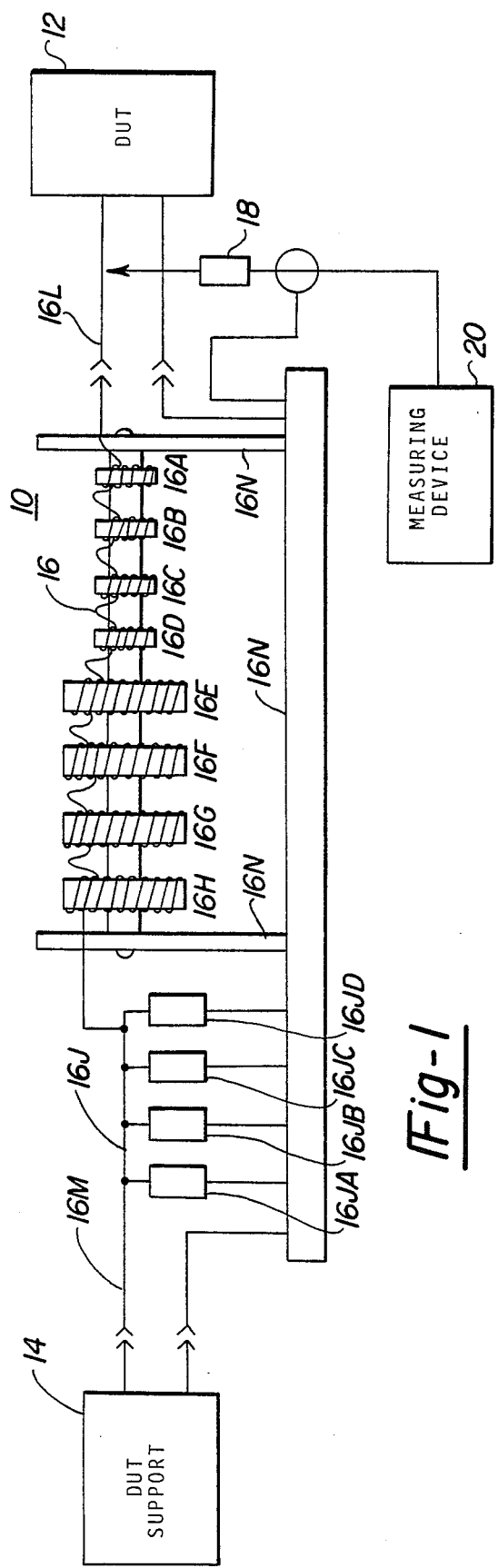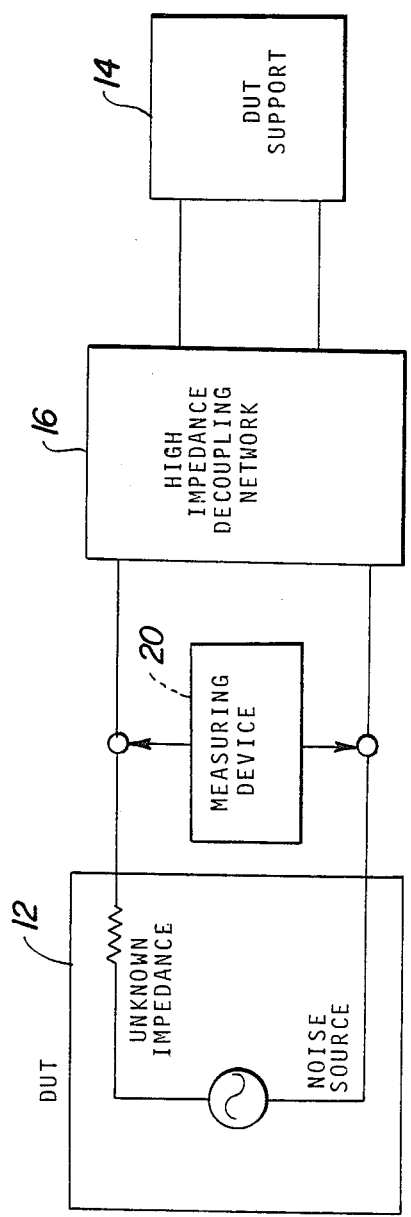

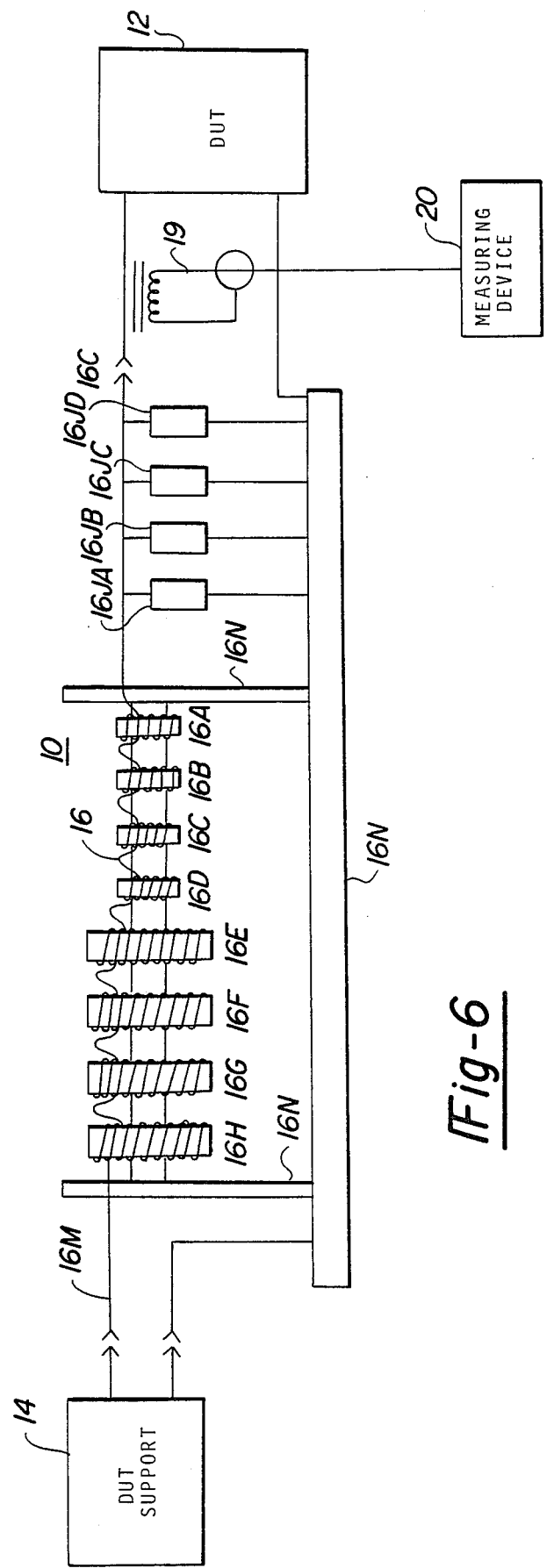

CONDUCTIVE EMI TEST SYSTEM, A DECOUPLING NETWORK THEREFOR

BACKGROUND OF THE INVENTION

1. Field of Invention

This invention relates to conducted electromagnetic interference (EMI) testing and more particularly in a preferred embodiment to decoupling apparatus and methods used to determine EMI sources and receptors within electrical equipment.

2. Description of the Prior Art

Various techniques have been employed to detect, measure and then suppress EMI in sensitive electrical equipment or test items. Interference or susceptibility detection and measuring should be conducted with the test item operating as close to service conditions as possible. Also the test item normally is operated in its intended manner with anticipated inputs applied and its outputs normally loaded.

A problem exists with simulating service conditions and normal manner of operation. To bring a test item out of its normal operating environment and to place it on a bench for a test, an actual duplication of operation of the test item seldom occurs. For example, if in a vehicle equipped with an engine control system that includes a microcomputer as a controller, assume it is desired to use a particular portable mobile two-way radio. Discovering that the radio works when the engine is cutoff but doesn't work well while the engine hs running, the engine control system is then removed from the vehicle and placed in a bench test environment for study. A simulator (support for the engine control system) is used to make the control system work as if it is in the vehicle. Also assume the system responds as if it is operating in the vehicle controlling what it is supposed to be controlling. Assume also, the engine control system generates the same interference that it was putting out before it was placed on the bench; but now the interference reacts with the simulator. By virtue of change in wiring, the coupling between harnesses, other components and the impedance and length of wires, the engine control system generally radiates and conducts a different amount of interference.

Efforts have been made to standardize bench test setups in order to gain data that approaches actual circumstances.

In prior bench tests under similar circumstances, line impedance stabilization networks (LISN's) have been recommended in a number of interference and susceptibility specifications, for insertion in power leads to offer something approaching a standard impedance to the radio frequency (RF) current from test items. The LISN's, as required by some military specifications introduce a standard 50 ohm power-source impedance for the test item so that conducted RF interference measurements can be compared to pass/fail limits without accounting for a source-impedance variable. But, however, in several LISN designs, a 5-microhenry coil is used, so the device is suitable for use from 150 KHz to 25 MHz. Over this range, the source-impedance varies from about 5 ohms at 150 KHz to 50 ohms at 25 MHz. It is not usable much above 25 MHz due to stray impedance. While it does furnish a standard impedance, it is not the impedance seen in the normal installation. It was never intended to be anything other than an A.C. power lines simulator.

Normally when trying to identify the potential of a device being an interference source, it is thought that this determination depends upon how you measured the interference emanating from source. This implies that different test processes produced different results for the same interference source. Realizing the above conditions exist, efforts were made toward devising interference measuring technique that didn't depend upon how the interference was measured.

BRIEF SUMMARY OF THE INVENTION

The present invention is concerned with apparatus and methods used for analyzing EMI emissions and/or susceptible of test items under bench test conditions. A series of resonators are configured and interconnected in a particular manner along with a shunt capacitance network to form a decoupling device. This decoupling device, usually disposed between the test item and its support system, provides a means for coupling dc and lower frequency signals needed for normal test item operations but decoupling essentially all other high frequency signals. Interferring signals from the test item confront essentially open circuit impedance with respect to the decoupling network input; and the test item is forced to produce its highest noise voltage, the decoupling network acting as a worst case load with respect to the output ofthe test item.

Departing from the normal approach to noise studies of detecting, measuring and then suppressing EMI, using the decoupling network and testing for worst case interference parameters provide a repeatable scheme for determining worst case signals in any environment in which the test item may be employed. After establishing worst case interference parameters, modification technique of test item circuit components and connectors may be employed to minimize the affect of generating EMI sources or to immunize susceptible receptors within the test item.

BRIEF DESCRIPTION OF THE DRAWING

FIG. 1 is a side view of a decoupling network within a block diagram of a bench test setup for analyzing EMI;

FIG. 2 is block diagram of a noise source with an unknown impedance being measured using a high impedance decoupling network to evaluate its worst case noise potential;

FIG. 6 is a side view of a decoupling network within a block diagram of a bench test setup for measuring short circuit currents.

DETAILED DESCRIPTION OF A PREFERRED EMBODIMENT

Figure 3:
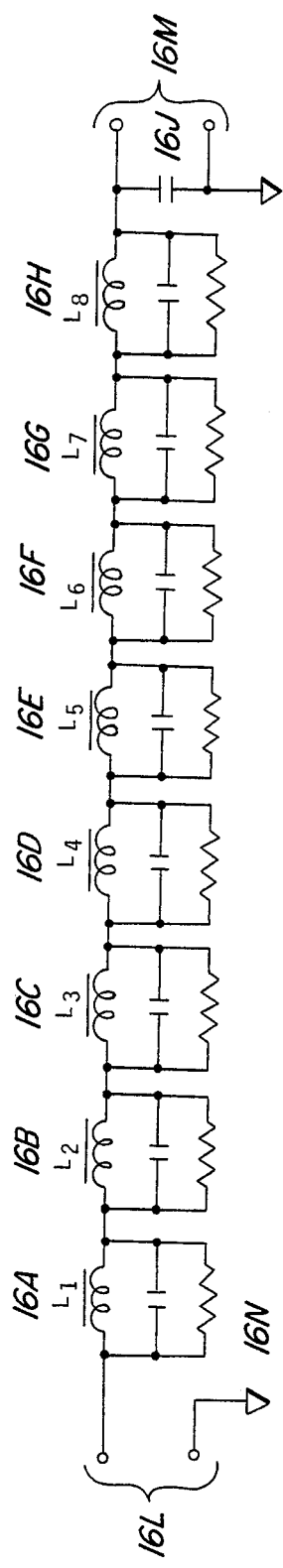
FIG. 3 schematically depicts the decoupling network of this invention.

FIG. 1 is a side view of a decoupling network within a block diagram of a bench test setup 10 for analyzing EMI. A test item or device under test (DUT) 12 is coupled to its DUT support 14 via a decoupling network 16. The support 14 provides all the power and data signals necessary to operate the DUT. Illustratively, the DUT 12 may be an engine control system that includes a microcomputer as a controller and the DUT support 14 may be a simulator that makes the engine control system function just as it would in a vehicle providing, e.g. the necessary voltages and sensor inputs and output loads.

Coupled between the input 16L of decoupling network 16 and conventional measurement instrumentation 20, is a conventional high impedance probe 18 for coupling noise signals from the input side of the decoupling device to the instrumentation. The instrumentation may be the type used to obtain time or frequency analysis data.

Decoupling network 16 presents a low passband to the signals from DUT support 14 necessary for DUT operation and essentially an open circuit impedance to signals from both the DUT and its support within a chosen frequency band. Measurements of open circuit noise voltages from the DUT are desired.

When one is interested in open circuit voltage measurement, you load the DUT into the highest impedance one can reasonably obtain. FIG. 2 is a block diagram illustratgive of test setup for evaluating worst-case noise potential of DUT 12, DUT 12, which receives support power from DUT support 14, includes a noise source with an unknown impedance. High impedance decoupling network 16 impedance. High impedance decoupling network 16 impels DUT 12 to emit worst-case noise voltage signals which measuring device 20 assesses.

To achieve this high impedance, a serially connected network of inductance resonators 16A through 16H of FIG. 1 has been developed which operate effectively over a broad band of frequencies shunted by a bank of parallel capacitors 16J which also operate over a broad band of frequencies. Various compromises are made with respect to the resonators that are formed and the capacitors that are used to form the decoupling network 16.

In this preferred embodiment, the decoupling network 16 is designed to produce substantially maximum uniform input impedance over a frequency range illustratively from 500 KHz to 300 MHz. Network 16 provides DC resistance of about 0.8 ohms for DC currents up to about 2 amperes.

To tailor the decoupling network to meet the above requirements, several steps must be taken along with several design compromises. Realizing that the intent is not to design an ideal filter, but rather to design a device that causes the DUT 12 to emit worst case noise voltages, a high impedance network should be formed Realizing that every inductor resonates at some specific frequency and that it exhibits its maximum impedance at its parallel resonance, the limitation on its usefulness as a decoupling isolator is the "Q" value which must be high enough to meet the minimum impedance desired but low enough to provide an acceptable bandwidth.

To form a high impedance network which spans a broad range of frequencies, cascaded resonators must be formed. If maximum "Q" networks are used, a very large number.

of high "Q" networks would be required. Thus to gain a broad band high impedance network yet not employ an excessive number of high "Q" networks, a compromise should be made. To form the preferred embodiment one should optimize the impedance of a chosen number of networks so as to provide at least a minimum impedance of 500 ohms at the maximum frequency of the voltages that each network will confront. Also the "Q" of each coil should be low enough to gain as much bandwidth of coverage for each cascaded impedance.

Typically, parameters for winding inductors are specified by core manufacturers. The data supplied by the manufacturers is usually sufficient for winding inductors of practically any value within the limits of the core and wire materials. But, however, such data isn't usually suitable for forming a cascaded set of resonators used in this invention. Also, with respect to saturation of the core, one should avoid establishing DC magnetizing forces that would saturate the core at the desired current range of the decoupling network. Thus the manufacturers core data should be consulted for magnetic characteristics of the selected core material.

Since the decoupling network 16 isn't a filter but a high input impedance cascaded resonator device, an equivalent circuit of the decoupling network is depicted in FIG. 3 illustrating the equivalent components. The resonators are designated 16A–16H. Each resonator is formed from an inductor in parallel with a resistor and a capacitor to form a tuned circuit of a chosen center frequency and a specific "Q". The parallel capacitance result from stray capacitance which occur between windings about the toroidal cores. The resistors result from the DC resistivity of the windings and the magnetic core losses.

A terminating end of the lowest frequency resonator 16H and one end of a ground plane 16N disposed a chosen parallel distance from the resonators is shunted by a bank of parallel bypass capacitors, shown in the equivalent circuit as a single capacitance 16J. The output terminals 16M taken from across the shunt forms a single ended decoupler output. A lead end of the highest frequency resonator 16A and another end of the ground plane 16N are connected to an input terminal 16L to form a single-ended decoupler input.

In establishing the number of resonators needed for the coupling network of FIG. 1, one must take into account the relationship between (a) the core material, wire size, the number of turns of wire employed in constructing cores that resonate at chosen frequencies and (b) the amount of bandwidth achieved when lowering the "Q" to provide for (1) an optimum impedance across a broadband of noise frequencies without core saturation and (2) a passband for desired voltage signals. As shown in FIG. 4A, there is depicted a graph of "number of turns" e.g. number 22 wire about a number of 106 toroidal core versus resonant frequency for the four lower frequency resonators 16E through 16H. The number 106 core designates a core material of Amidon Associates of North Hollywood, Calif. By taking from or adding windings to the cores, an optimum "Q" and bandwidth for each core at a chosen related resonant frequency is established.

Figure 4B:
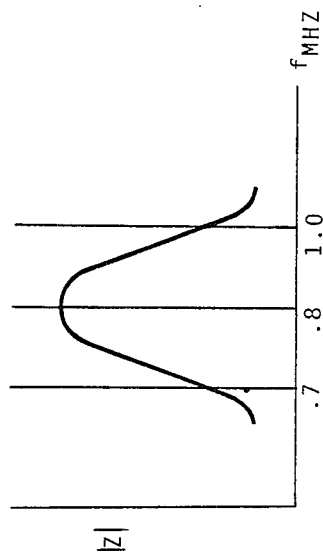
FIG. 4B is a "Q" curve for a particular resonator.
Figure 4A:
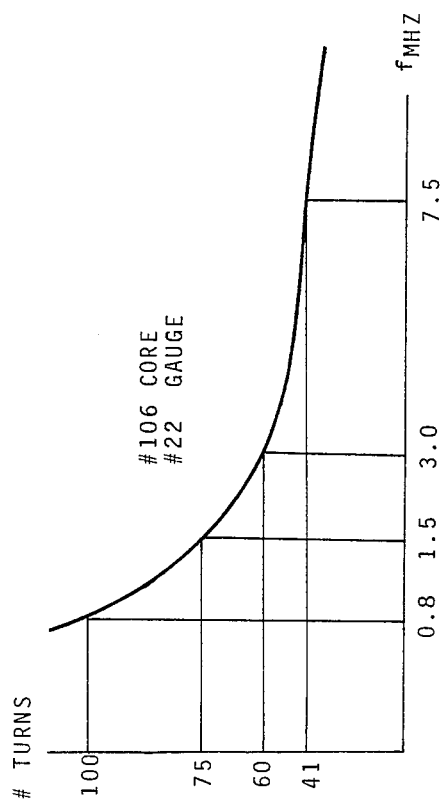
FIG. 4A is a graphical plot of a number of turns needed to form resonators at a plurality of resonant frequencies.
Figure 4C:
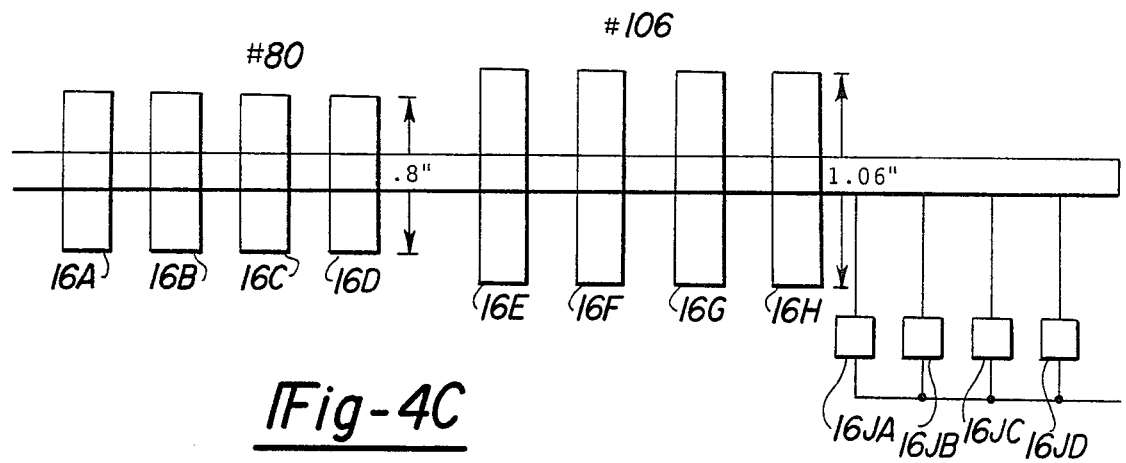
FIG. 4C is a plan view of the decoupling network.
Figure 4D:
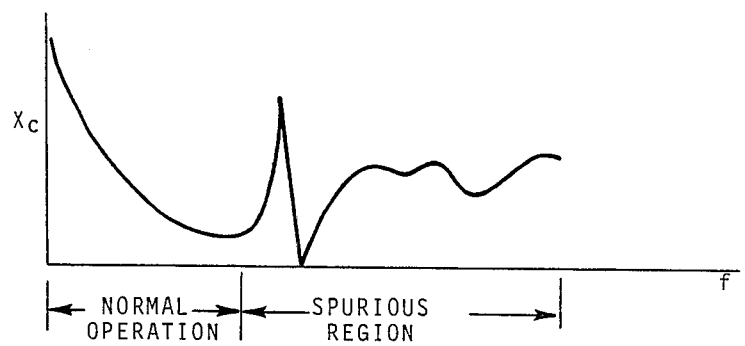
FIG. 4D is a response curve for a typical bypass capacitor used in this invention.
Figure 4E:
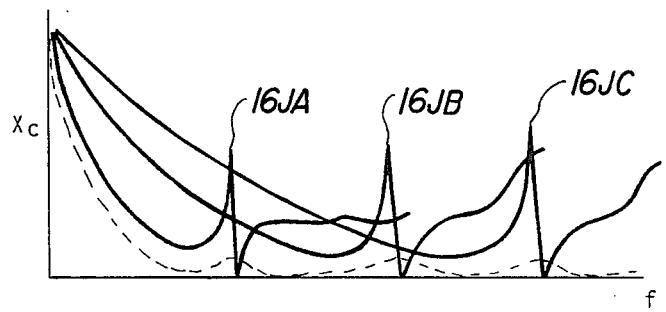
FIG. 4E illustrates the response curve for a bank of capacitors employed as the bypass for this invention.
Figure 4F:
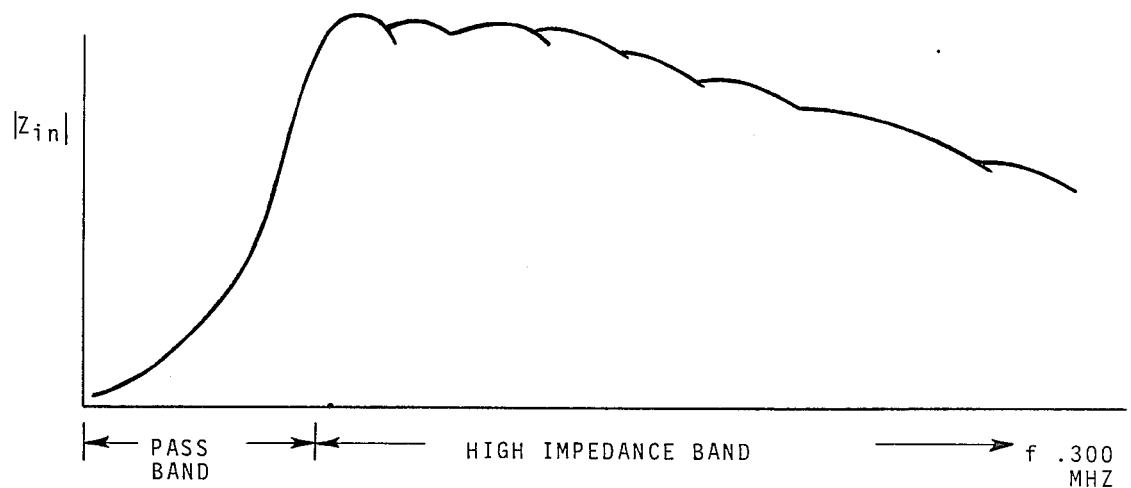
FIG. 4F is the response curve for the decoupling network.

FIG. 4B illustrates a plot of absolute impedance values versus frequency in megahertz which indicates optimum "Q" for resonator 16H of FIG. 1 calibrated to resonate at 0.8 MHz and to provide high impedance from a lower 3 db frequency of 0.7 MHz to an upper 3 db frequecay of 1.0 MHz. Each succeeding resonator 16E through 16A is adjusted similarly to form a family of resonators with increasing resonant frequencies with overlapping bandwidths as depicted in FIG. 4F.

A similar procedure is performed for the bypass capacitors 16J. The capacitors are more broad banded than the inductors, thus a fewer number of capacitors are required. Again we look at the DUT 12 of FIG. 1 and determine what signal frequencies and voltages are required for normal operation. For the DUT 12 to operate, the limitations of the capacitors must be considered. FIG. 4D depicts reactance versus frequency of a typical capacitor which might be used with DUT 12. It is desired that DUT 12 drive the capacitance; i.e. at operating ranges of frequencies used by DUT 12, so that the capacitor will pass the signals. As for the interfering signal frequencies, the capacitors should provide a known, impedance return path to ground. As in FIG. 4D, normally as you go higher in frequency, the reactance of the capacitance goes down. When you continue to go higher in frequency, series resonance is reached and the reactance drops way down. At frequencies above resonance, the reactance rises and then spurious reactions occurs. The capacitors are not useful in this region. Thus, as depicted in FIG. 4C, the several capacitors 16JA-16JD, that are used as bank of parallel capacitors, are chosen to provide a low impedance return path to ground for the noise frequencies but do not significantly alter the operating frequency signals required by the DUT. Typical values for the four capacitors are 1, 0.1, 0.01 and 0.001 microfarads.

The operation of system 10 will now be discussed. With reference of FIG. 1, the input connected 16L of decoupling network 16 is coupled to DUT 12 and the output connector 16M is connected to the output of DUT support 14. If we assume that DUT 12 is the engine controller mentioned supra, and that it requires dc and a 12 KHz clock signal which can be fed from the DUT support 14 over the single ended decoupling network 16 to DUT 12. If we also assume DUT 12 operates normally when the signals from DUT support 14 are supplied due to the pass band capabilities of network 16, the interfering signal voltages leaving DUT 12 will run into the high impedance of network 16 and be reflected back towards the DUT 12. Since the input to network 10 will appear as an open circuit network, the interfering voltages will increase to establish a worst case interfering signal voltage. Then a high impedance probe 18 can be connected across the input terminal 16L to obtain a time or frequency domain reading on suitable measurement equipment 20 of the worst case noise voltage emanating from DUT 12. Then a variety of suppression techniques may be employed to minimize this worst case voltage, presenting the user with an analysis tool that departs from the usual approach of detecting, measuring and then attempting to suppress the interfering voltages.

Figure 5:
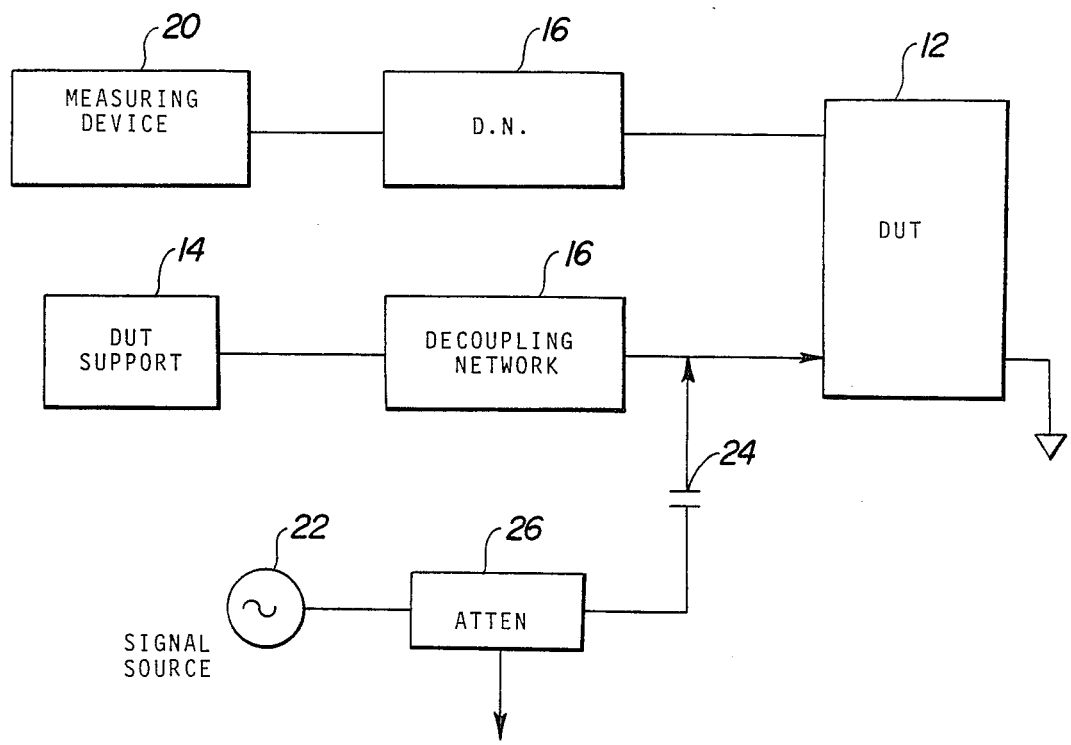
FIG. 5 is a block diagram of a susceptibility bench test setup in accordance with this invention.

FIG. 5 depicts another use for the decoupling network in analyzing the susceptibility of DUT 12 to noise. Here, a signal generator 22 is used as a substitute interference source for what are suspected to be potential interfering devices in the service environment. The generator 22 is coupled to the input of decoupling network 16 via a dc blocking capacitor 24 and an attenuator 26. The attenuator 26 should be connected as close as possible to the DUT. Suitable measurement equipment 18 may be coupled through another decoupling network 16 to the input of DUT 12 to gain a measure of susceptibility of DUT 12.

Having developed broad and high impedance decoupling network to evaluate open circuit interference voltages, with a minor modification, short circuit current measurements can be made as well. This will give a measure of the current potential of interference sources.

This modified network is shown in FIG. 6 where the same capacitor bank 16A-16D is placed at the DUT end rather than at the other end of the network forming a low impedance load for shunting the interference current to ground 16N. A current probe 19 is used on this shunted line for providing a current signal to measuring device 20 to measure worse case interference currents.

TABLE I

| Freq. Range: | 500 KHz-300 MHz |
| --- | --- |
| Insertion Loss:<br>(From Port 16L to Port 16M) | 80 db or greater |
| Input Impedance: | 500 ohms or greater |

TABLE II

Core Types:
HIGHER FREQ. CORES 0.8 INCH DIA.
IRON POWDER TOROIDAL CORE
LOWER FREQ. CORES 106 INCH DIA.
IRON POWDER TOROIDAL CORE

| Number of Turns: | FR | Number Turns of 22 Guage Wire | Q | Inductance (MicroHenry) |
| --- | --- | --- | --- | --- |
| 16A | 300 MHz | 7 | 4 | 3 ± .5 |
| 16B | 100 | 12 | 1.0 | 7 ± .5 |
| 16C | 46 | 22 | 2.4 | 24 ± 1 |
| 16D | 18 | 35 | 4.0 | 63 ± 3 |
| 16E | 7.5 | 41 | 6.5 | 175 ± 5 |
| 16F | 3.0 | 60 | 9 | 374 ± 8 |
| 16G | 1.5 | 75 | 11 | 582 ± 10 |
| 16H | .8 | 100 | 16 | 1025 ± 15 |

Table 1 specifies operating parameters of decoupling network 16 and Table 2 provides parameters used to develop the preferred embodiment of this invention. FIG. 4C also provides related structural data regarding the core type and diameters.

A person skilled in the art may make various changes and substitutions to the layout of parts shown without departing from the spirit and scope of the invention.

What is claimed is:

1. A conductive electromagnetic interference test system determining electromagnetic interfering source components and receptor components within a device under test at worst-case electromagnetic interference conditions, said system comprising:
    (a) means for supplying power and signal support to said device under test;
    (b) measuring means coupled between said power and signal support means and said device under test, said measuring means being responsive to electromagnetic interference voltage signals transferred between said power and signal support means and said device under test; and
    (c) a decoupling means disposed with an output end coupled to an output of said power and signal support means and an input end coupled to an input of said measuring means for coupling power and signal support to said device under test while opposing the passage of selected electromagnetic interfering voltage signals from both said device under test and said power and signal support means, said decoupling means providing a substantially worst-case high impedance load for said device under test while said device under test is operating in response to the power and signal support from said support means, the high impedance load causing interfering voltage signals from said device under test to confront substantially an open circuit impedance with respect to an input of said decoupling means, and causing said device under test to produce a worst case interference voltage signal which can be measured by said measuring means to provide a reference upon which a repeatable measure of an interference voltage signal can be determined when interference suppression techniques are applied to rid or reduce electromagnetic interfering source and receptor components of said device under test.

2. Apparatus in accordance with claim 1 wherein said decoupling means includes a plurality of serially connected resonators, each of said resonators being tuned to a selected resonance frequency and a particular "Q" and bandwidth so as to create the particular high impedance load to oppose a chosen broadband of electromagnetic interference signals.

3. Apparatus in accordance with claim 2 wherein the high impedance load has a minimum impedance of 500 ohms at a maximum frequency of the interference voltage signal that each resonator confronts.

4. Apparatus in accordance with claim 1 wherein said decoupling means includes a ground plane spaced a chosen parallel distance from said plurality of serially connected resonators, wherein a lead of a maximum resonant frequency resonator and one end of said ground plane forms a single-end input of said decoupling means.

5. Apparatus in accordance with claim 1 wherein said decoupling means includes a plurality of parallel connected bypass capacitors shunted across a terminating end of a minimum resonance frequency resonator and another end of said ground plane which forms a single-end output of said decoupling means, capacitors being chosen to provide a low impedance return path to said ground plane for the interference voltage signals without opposing passage of operating frequency voltage signals to said device under test.

6. A conductive electromagnetic interference test system determining electromagnetic interfering source and receptor components within a device under test, at worst-case interference conditions, said system comprising:
  (a) means for supplying power and signal support to said device under test;
  (b) measuring means coupled between said power and signal support means and said device under test, said measuring means being responsive to short circuit currents transferred between said power and signal support means and said device under test; and
  (c) a decoupling means disposed with an output end coupled to an output of said power and signal support means and an input end coupled to an input of said measuring means for coupling power and signal support to said device under test while opposing the passage of selected electromagnetic interfering current and voltage signals from both said device under test and said power and signal support means, wherein said decoupling means includes a plurality of parallel connected by-pass capacitors shunted across a leading end of a maximum resonance frequency resonator and a first end of said ground plane forming a single-ended input of said decoupling means, said capacitors forming a low impedance load for the short circuit currents without opposing passage of operating frequency voltage and current signals to said device under test, said decoupling means having a shunted current path between said device under test and said bank of capacitors wherein said interference current signals can be measured by said measuring means to provide a reference upon which a repeatable measure of interference current signals can be determined when interference suppression techniques are applied to eliminate or reduce electromagnetic interfering components of said device under test.

7. A method of performing a bench test measurement of worst case electromagnetic interference voltage signals being conductively transferred from a device under test, determining electromagnetic interfering source and receptor components within said device under test at worst-case electromagnetic interference conditions, which method comprises:
  (a) connecting a power and signal support means to said device under test so that said device under test operates as in a normal environment;
  (b) coupling measuring means between said power and signal support means and said device under test so that measurement of interference voltage signals may be performed;
  (c) connecting a decoupling means between said power and signal support means and said measuring means so that power and signal support is supplied to said device under test causing said device under test to operate while opposing selected electromagnetic interfering voltages signals from both said device under test and said power and signal support means, said decoupling means providing a substantially worst case high impedance load for said device under test;
  (d) measuring, using said measuring means, a worst case interfering voltage signal from said device under test as said decoupling means creates the substantially worst case high impedance load for said device under test; and
  (e) identifying electromagnetic interfering receptor and/or source components within said device under test while said decoupling means is creating the substantially worst case high impedance load for said device under test, the substantially worst case high impedance load being gradually reduce as the receptors and source components are removed.

8. The method of claim 7 wherein an input end of said decoupling means is coupled to said device under test and an output end is coupled to said measuring means.

9. The method of claim 8 also including a method for determining susceptibility of said device under test to interfering voltages signals including the steps of:
  (a) coupling an input of a second decoupling means across an input of said device under test; and an output of said second decoupling means to an input of a second measuring means responsive to the interfering voltage signals.
(b) coupling a signal generator to the input of said decoupling means so as to permit injecting an interference voltage upon the input of said device under test.
(b) triggering on said signal generator to inject a suitable added interference voltage signal to the input of said device under test in order to obtain any measure of abnormal operation of said device under test while the added interference voltage signal is being injected.

10. A method of performing a bench test measurement of worst case electromagnetic interference current signals being conductively transferred from a device under test after removal of said device from a normal operating environment, which method comprises:
(a) connecting a power and signal support means to said device under test so that said device under test operates as in the normal environment;
(b) coupling measuring means between said power and signal support means and said device under test so that measurements of interference current signals may be performed;
(c) connecting a decoupling means such that an output is coupled to an output of said power and signal support means, and an input end is coupled to an input of said measuring means for coupling power and signal support to said device under test, while opposing the passage of selected electromagnetic interfering current and voltage signals from both said device under test and said power and signal support means, wherein said decoupling means includes a plurality of parallel connected by-pass capacitors shunted across a leading end of a maximum resonance frequency resonator and a first end of said ground plane forming a single-ended input of said decoupling means, said capacitors forming a low impedance load for the short circuit currents without opposing passage of operating frequency voltage and current signals to said device under test, said decoupling network having a shunted current path between said device under test and said bank of capacitors wherein said interference current signals can be measured by said measuring means to provide a reference upon which a repeatable measure of interference current can be determined when interference suppression techniques are applied;
(d) measuring, using said measuring means, a worst case interfering current signal from said device under test as said decoupling means creates the substantially worst case low impedance load for said device under test; and
(e) applying interference suppression techniques to determine short circuit current sources and receptors in said device under test.

* * * * *